(12) United States Patent
Shen et al.

(10) Patent No.: US 6,833,564 B2
(45) Date of Patent: Dec. 21, 2004

(54) INDIUM GALLIUM NITRIDE SEPARATE CONFINEMENT HETEROSTRUCTURE LIGHT EMITTING DEVICES

(75) Inventors: Yu-Chen Shen, San Jose, CA (US); Mira S. Misra, Los Gatos, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/033,349

(22) Filed: Nov. 2, 2001

(65) Prior Publication Data

US 2003/0085409 A1 May 8, 2003

(51) Int. Cl.[7] ............................................. H01L 33/00
(52) U.S. Cl. .................................... 257/94; 257/103
(58) Field of Search ........................................... 257/94

(56) References Cited

U.S. PATENT DOCUMENTS

| | | | |
|---|---|---|---|
| 6,046,464 A | | 4/2000 | Schetzina ..................... 257/96 |
| 6,072,189 A | * | 6/2000 | Duggan ........................ 257/14 |
| 6,285,696 B1 | * | 9/2001 | Bour et al. .................... 372/45 |
| 6,326,236 B1 | * | 12/2001 | Koide et al. ................. 438/107 |
| 6,455,337 B1 | * | 9/2002 | Sverdlov ....................... 438/22 |

FOREIGN PATENT DOCUMENTS

JP        11243251    *   9/1999

* cited by examiner

*Primary Examiner*—Douglas Wille
(74) *Attorney, Agent, or Firm*—Patent Law Group LLP; Rachel V. Leiterman

(57) ABSTRACT

A III-nitride light emitting device including a substrate, a first conductivity type layer overlying the substrate, a spacer layer overlying the first conductivity type layer, an active region overlying the spacer layer, a cap layer overlying the active region, and a second conductivity type layer overlying the cap layer is disclosed. The active region includes a quantum well layer and a barrier layer containing indium. The barrier layer may be doped with a dopant of first conductivity type and may have an indium composition between 1% and 15%. In some embodiments, the light emitting device includes an InGaN lower confinement layer formed between the first conductivity type layer and the active region. In some embodiments, the light emitting device includes an InGaN upper confinement layer formed between the second conductivity type layer and the active region. In some embodiments, the light emitting device includes an InGaN cap layer formed between the upper confinement layer and the active region.

27 Claims, 4 Drawing Sheets

INDIUM GALLIUM NITRIDE SEPARATE CONFINEMENT HETEROSTRUCTURE LIGHT EMITTING DEVICES

BACKGROUND

Semiconductor light-emitting devices (LEDs) are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, or III-nitride substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region.

The active region is often a single quantum well layer, or multiple quantum well layers separated by and sandwiched between layers of semiconductor materials with larger bandgap energies than the quantum well layers. The larger bandgap energy layers that separate the quantum well layers are often referred to as barrier layers. The larger bandgap energy layers between which the active region is located are often referred to as cladding or confinement layers. Other layers may be located between the confinement layers and the active region. The barrier and confinement layers provide barriers to the diffusion of charge carriers away from the active region.

FIG. 1 illustrates an example of an active region sandwiched between two confinement layers, as described in U.S. Pat. No. 6,046,464. A GaN active region 112 is located between two confinement layers 114a and 114b of $Al_{1-x}Ga_xN$. Aluminum is often used in confinement layers because the presence of aluminum in a III-nitride semiconductor layer typically increases the bandgap of that layer, providing for good carrier confinement.

The use of AlGaN confinement layers creates several problems.

First, it is difficult to achieve the required hole concentration in Mg-doped AlGaN. One reason is that the activation energy for Mg increases as the composition of Al increases in AlGaN. It has been observed that in GaN, only about 1% of the Mg incorporated is activated at room temperature. It has also been observed that the activation energy of a dopant increases as the bandgap energy of the host material increases. Therefore, the percentage of activated Mg atoms in AlGaN is expected to be less than 1%. This means that higher concentrations of Mg atoms must be incorporated into the AlGaN layer in order to achieve the required hole concentrations. Requiring high Mg concentration in AlGaN has two disadvantages. First, it is difficult to incorporate high Mg concentrations in AlGaN during growth. Second, the presence of high dopant concentrations can undesirably affect the quality and electronic properties of the AlGaN single crystal film.

Second, large polarization fields exist at the GaN/AlGaN interface. These polarization fields are caused by the different electronegativities of Al, In, Ga, and N, as well as the asymmetric nature of the wurtzite crystal structure present in III-nitride LEDs. The polarization fields essentially produce a sheet charge between the GaN and AlGaN interface, which moves the energy band diagram up or down, depending on the polarity of the sheet charge at the interface. At the GaN/AlGaN interface, a positive sheet charge exists and pulls the conduction energy band down, which reduces the effectiveness of AlGaN as a confinement layer. The effect of polarization fields is illustrated in FIG. 2, which is an energy band diagram of a device with an AlGaN confinement layer. As illustrated in FIG. 2, the bandgap of quantum well layer 310 is less than the bandgap of cap layer 302, which is less than the bandgap of confinement layer 304. However, the polarization field at the cap layer/confinement layer interface has pulled the energy diagram at point 308 down below the quasi-Fermi level 306. The quasi-Fermi level is most easily understood as the energy level below which charge carriers can reside at T=0. Because the conduction band is pulled down at point 308, the voltage needed for similar current densities is increased. This decreases the energy barrier and the electron confinement of the AlGaN layer.

Third, growth of AlGaN requires higher temperatures than other GaN-based layers. One way to change to a higher growth temperature is to initiate a pause in the growth. Growth pauses are generally undesirable because they allow impurities to accumulate on the surface of the crystal, which can degrade the quality of the crystal. In addition, the high temperature required for AlGaN can undesirably impact the material properties of the layers in the active region.

SUMMARY

In accordance with the invention, a III-nitride light emitting device includes a substrate, a first conductivity type layer overlying the substrate, a spacer layer overlying the first conductivity type layer, an active region overlying the spacer layer, a cap layer overlying the active region, and a second conductivity type layer overlying the cap layer. The active region includes a quantum well layer and a barrier layer containing indium. One of the spacer layer and the cap layer contain indium. The barrier layer may be doped with a dopant of first conductivity type and may have an indium composition between 1% and 15%. In some embodiments, the light emitting device includes a lower confinement layer formed between the first conductivity type layer and the active region. The lower confinement layer may be doped with a dopant of first conductivity type and may have an indium composition between 0% and 15%. In some embodiments, the light emitting device includes an upper confinement layer formed between the second conductivity type layer and the active region. The upper confinement layer may be doped with a dopant of second conductivity type and may have an indium composition between 0% and 15%. The cap layer may be doped with a dopant of second conductivity type and may have an indium composition between 0% and 15%. The spacer layer may be doped with a dopant of first conductivity type and may have an indium composition between 0% and 15%.

DETAILED DESCRIPTION

Figure 1:
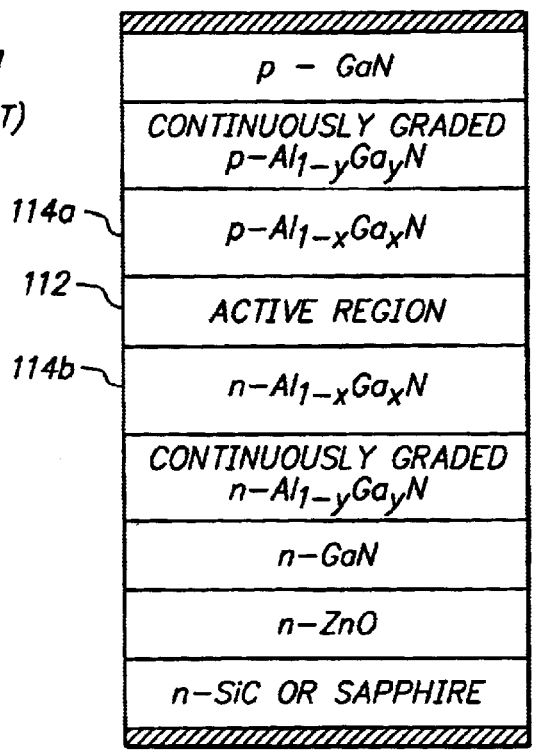
FIG. 1 illustrates a prior art III-nitride LED.
Figure 2:
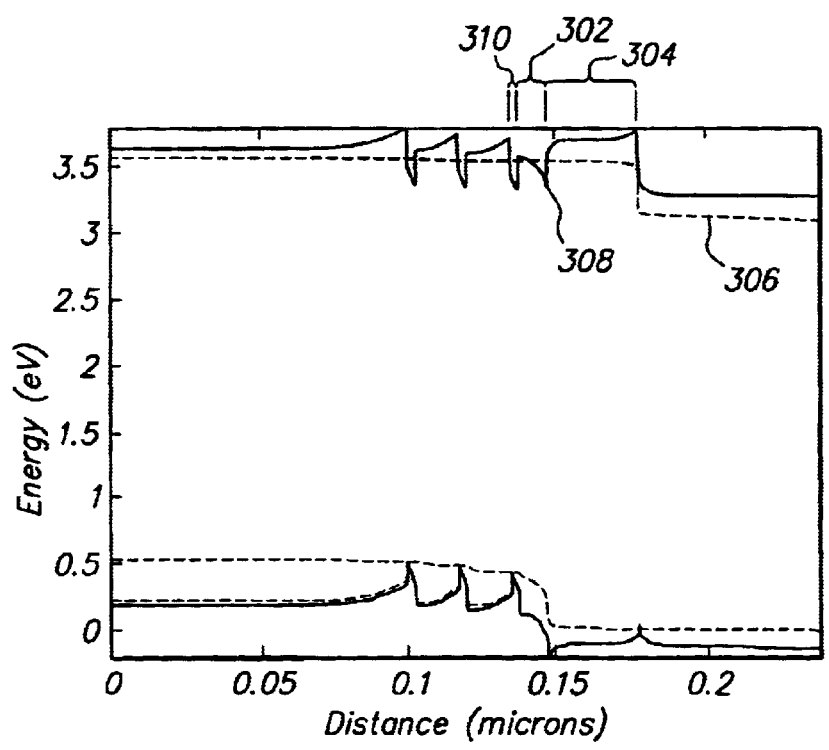
FIG. 2 illustrates an energy band diagram of a device with an AlGaN confinement layer.
Figure 3:
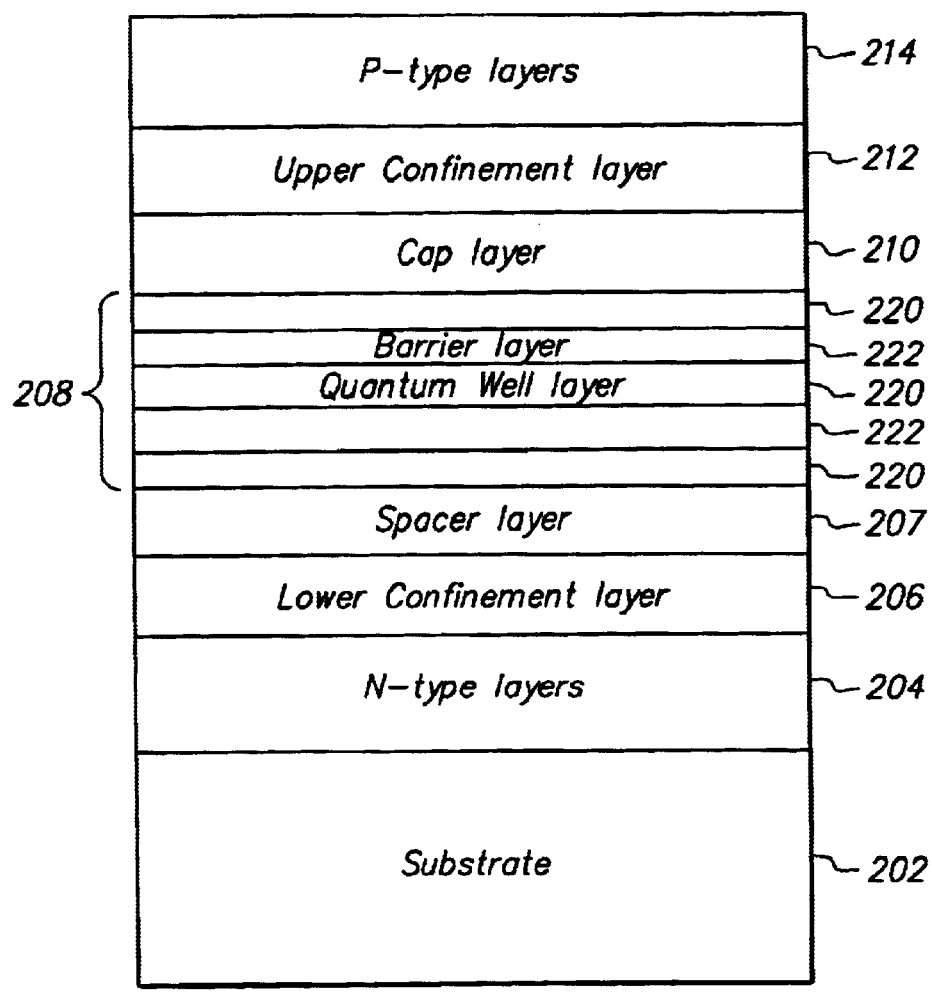
FIG. 3 illustrates an LED according to the present invention.

FIG. 3 illustrates an LED 200 incorporating aspects of the present invention. A single n-type layer or stack of n-type layers 204 is formed on a substrate 202. A lower confinement layer 206 is formed over n-type layers 204. Active region 208 is sandwiched between a spacer layer 207 and a cap layer 210. Active region 208 includes barrier layers 222, and quantum well layers 220. An upper confinement layer 212 is formed over cap layer 210. Finally, a single p-type layer or stack of p-type layers 214 is formed over upper confinement layer 212. P-type layers 214 may include a contact layer. An n-contact is electrically connected to one of n-type layers 204 and a p-contact is electrically connected to one of p-type layers 214. If substrate 202 is conductive, the n-contact may be deposited on the underside of substrate 202. Or, a portion of p-type layers 214, confinement layer 212, active region 208, and confinement layer 206 is removed to expose n-type layers 204. Both the p-contact and the n-contact are then deposited on the same side of the device. In configurations where both contacts are deposited on the same side of the device, light may either be extracted through the substrate (known as a flip chip device) or through the contacts. Though LED 200 is shown with n-type layers 204 closest to the substrate, the structure can be reversed such that the p-type layers 214 are formed closest to the substrate. In addition, n-type layers 204 may include a p-type layer and p-type layers 214 may include an n-type layer. Further, any of lower confinement layer 206, spacer layer 207, barrier layers 222, cap layer 210, and upper confinement layer 212 may be either n-type or p-type.

In some embodiments of the invention, lower confinement layer 206, spacer layer 207, quantum well layers 220, barrier layers 222, cap layer 210, and upper confinement layer 212 are each InGaN. Table 1 illustrates the In composition of each layer.

TABLE 1

| Upper confinement layer 212 | $In_{x5}Ga_{1-x5}N$ |
|---|---|
| Cap layer 210 | $In_{x4}Ga_{1-x4}N$ |
| Barrier layers 222 | $In_{x3}Ga_{1-x3}N$ |
| Quantum well layers 220 | $In_{x2}Ga_{1-x2}N$ |
| Spacer layer 207 | $In_{x1}Ga_{1-x1}N$ |
| Lower confinement layer 206 | $In_{x0}Ga_{1-x0}N$ |

In the embodiment shown in Table 1, upper confinement layer 212 and lower confinement layer 206 have the smallest indium composition. Cap layer 210, barrier layers 220, and spacer layer 207 usually have a larger indium composition than confinement layers 206 and 212, and a smaller indium composition than quantum well layers 222. Quantum well layers 222 have the largest indium composition. Thus, $x_1, x_3, x_4 < x_2$; and $x_0, x_5 \leq x_1, x_3, x_4$.

Figure 4:
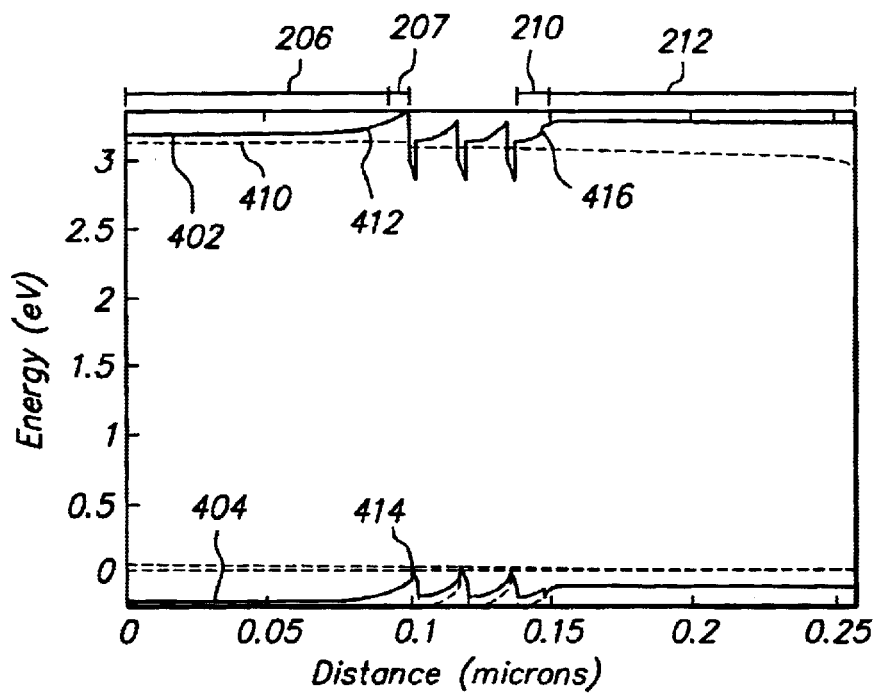
FIG. 4 illustrates an energy band diagram of a device according to the present invention.

In some embodiments, lower confinement layer 206 is a III-nitride layer lacking Al and doped n-type, usually with Si. Lower confinement layer 206 may be, for example, GaN or InGaN. Lower confinement layer 206 may have an indium composition of about 0% to about 15%, and usually has an indium composition of about 0% to about 2%. FIG. 4 illustrates an energy band diagram of a device incorporating a lower confinement layer 206. Lower confinement layer 206 is doped with a large enough dopant concentration to move the electron quasi-Fermi level 410 closer to the conduction band 402 at point 412, the interface between lower confinement layer 206 and spacer layer 207. The doping causes bending of the band structure which provides a barrier to holes in valence band 404 at point 414. Confinement layer 206 may be doped with an n-type dopant such as Si to a concentration of about $10^{15}$ cm$^{-3}$ to about $10^{22}$ cm$^{-3}$, and is usually doped to a concentration of about $10^{19}$ cm$^{-3}$ to about $5*10^{20}$ cm$^{-3}$. Lower confinement layer 206 may be between 50 and 20000 angstroms thick, and is usually between 250 and 500 angstroms thick. Typically, the presence of In in a layer lowers the band gap of that layer, thus in embodiments where lower confinement layer 206 contains In, the In composition should be less than the In composition of the quantum well layers and less than or equal to the In composition of the barrier layers.

In some embodiments, spacer layer 207 is an InGaN layer. Spacer layer 207 may have an indium composition between about 0% and about 15%, and usually has an indium composition between 0% and 5%. Spacer layer 207 may doped with an n-type dopant such as Si to a concentration of about $10^{15}$ cm$^{-3}$ to about $10^{19}$ cm$^{-3}$, and is usually doped to a concentration of about $10^{17}$ cm$^{-3}$ to about $10^{18}$ cm$^{-3}$. Spacer layer 207 may be between about 25 and 300 angstroms thick, and is usually between 100 and 200 angstroms thick.

Active region 208 has alternating quantum well layers 220 (FIG. 3) and barrier layers 222. In some embodiments, both quantum well layers 220 and barrier layers 222 are InGaN. Since increasing In composition reduces the band gap of a layer, quantum well layers 220 typically have a greater In composition than barrier layers 222, such that barrier layers 222 have a high enough band gap to confine charge carriers. Quantum well layers 220 may have an indium composition ranging between 4% and 25%. Barrier layers 222 may have an indium composition ranging between 0% and 15% and usually have an indium composition ranging between 1% and 5%.

In some embodiments, barrier layers 222 of the active region are doped n-type with Si in order to reduce polarization fields at the barrier/quantum well interface. Barrier layers 222 may be doped to a concentration of about $10^{15}$ cm$^{-3}$ to about $10^{19}$ cm$^{-3}$, and are usually doped to a concentration of about $10^{17}$ cm$^{-3}$ to about $5*10^{18}$ cm$^3$. Barrier layers 222 may range in thickness from 20 to 250 angstroms, and are usually between 60 and 130 angstroms thick. Quantum well layers 220 may range in thickness from 10 to 60 angstroms, and are usually between 15 and 30 angstroms thick. Though three quantum well layers 220 and two barrier layers 222 are shown in FIG. 3, more or fewer quantum well layers and barrier layers may be used.

In some embodiments, cap layer 210 is an InGaN layer containing the same In composition as the barrier layers in active region 208. Cap layer 210 may have an indium composition between about 0% and about 15%, and usually has an indium composition between 0% and 5%. Cap layer 210 may be doped with a p-type dopant such as Mg or doped with an n-type dopant such as Si to a concentration of about $10^{15}$ cm$^{-3}$ to about $10^{21}$ cm$^{-3}$, and is usually doped to a concentration of about $10^{19}$ cm$^{-3}$ to about $10^{20}$ cm$^{-3}$. Cap layer 210 may be between about 25 and 300 angstroms thick, and is usually between 50 and 120 angstroms thick.

In some embodiments, upper confinement layer 212 is InGaN doped with a p-type dopant such as Mg. Upper confinement layer 212 contains less In than the quantum well layers of active region 208, in order to confine the charge carriers to active region 208. The indium composition of upper confinement layer 212 may be between about 0% and about 15% and is usually between 0% and 2%. Turning again to FIG. 4, upper confinement layer 212 is doped with enough p-type dopant to move conduction band edge 416 away from the electron quasi-Fermi level at the interface of cap layer 210 and upper confinement layer 212. This provides a better wall to electron diffusion at edge 416. Upper confinement layer 212 may be doped to a concentration of about $10^{15}$ cm$^{-3}$ to about $10^{22}$ cm$^{-3}$, and is usually doped to a concentration of about $10^{19}$ cm$^{-3}$ to about $5*10^{20}$ cm$^{-3}$. Upper confinement layer 212 may be between about 50 and 20,000 angstroms thick, and is usually between 250 and 500 angstroms thick.

In some embodiments, a p-type contact layer is InGaN or GaN doped with a p-type dopant such as Mg. The p-type contact layer may have an indium composition ranging from about 0% to about 15%, and usually has an indium composition ranging between 0% and 2%. The p-type contact layer may be doped to a concentration of about $10^{15}$ cm$^{-3}$ to about $10^{23}$ cm$^{-3}$, and is usually doped to a concentration of about $10^{20}$ cm$^{-3}$ to about $10^{21}$ cm$^{-3}$. The p-type contact layer may be 10 to 500 angstroms thick, and is usually between 100 and 250 angstroms thick.

The band gaps of confinement layers 206 and 212 are generally greater than the band gaps of the barrier layers in active region 208, cap layer 210, and spacer layer 207. Within active region 208, the band gap of the barrier layers is greater than the band gap of the quantum well layer. Thus, in embodiments where both confinement layers, the cap layer, the spacer layer, the quantum well layers, and the barrier layers are all InGaN, the confinement layers have the lowest composition of In, the barrier layers, cap layer, and spacer layer all have a higher composition of In, and the quantum well layers have the highest composition of In.

Table 2 shows the indium composition of each of the layers of the device shown in FIG. 4.

TABLE 2

| Layer | Percent Indium Composition |
| --- | --- |
| Lower confinement layer 206 | 0% |
| Spacer layer 207 | 0% |
| Barrier layer 222 | 3% |
| Quantum well layer 220 | 15% |
| Cap layer 210 | 3% |
| Upper confinement layer 212 | 0% |

In some embodiments, lower confinement layer 206, spacer layer 207, cap layer 210, or upper confinement layer 212 may have a graded indium composition or graded dopant concentration. As used herein, the term "graded" is meant to encompass any structure that achieves a change in composition and/or dopant concentration in any manner other than a single step in composition and/or dopant concentration. In one example, the graded layer is a stack of layers, each of the layers having a different composition and/or dopant concentration than either layer adjacent to it. If the layers are of resolvable thickness, the graded layer is known as a step-graded or index-graded layer. In the limit where the thickness of individual layers approaches zero, the graded layer is known as a continuously-graded layer. The layers making up the graded smoothing layer can be arranged to form a variety of profiles in composition and/or dopant concentration versus thickness, including, but not limited to, linear grades, parabolic grades, and power-law grades. Also, graded smoothing regions are not limited to a single grading profile, but may include portions with different grading profiles and one or more portions with substantially constant composition and/or dopant concentration regions. For example, spacer layer 207 may have an indium composition that is graded from the indium composition in lower confinement layer 206 to the indium composition in barrier layers 220. Also, cap layer 210 may have an indium composition that is graded from the indium composition in barrier layers 220 to the indium composition in upper confinement layer 212. The graded spacer layer 207 and cap layer 210 create a "funnel" which directs charge carriers to the active region.

Figure 5:
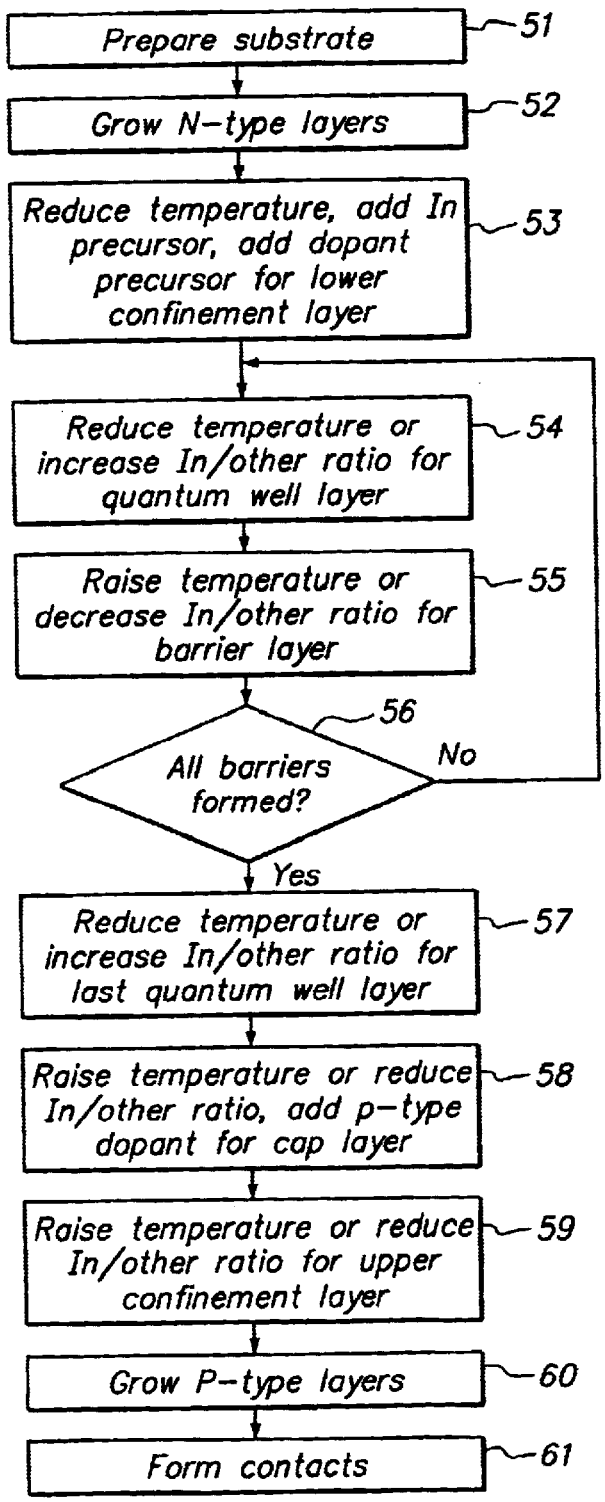
FIG. 5 illustrates a method of fabricating an LED.

FIG. 5 illustrates a method of fabricating a device according to aspects of the present invention. In stage 51, substrate 202, which may be SiC, sapphire, GaN, or any other suitable substrate, is polished on one or both sides then prepared for growth with various cleans. N-type layers 204 are epitaxially grown on substrate 202 in stage 52 by MOCVD. The substrate is placed in a reactor and precursor gases, such as tri-methyl gallium and ammonia, are introduced which react at the surface of the substrate to form GaN. Before bulk GaN growth, a III-nitride nucleation layer such as AlN, GaN, or InGaN may be grown over substrate 202. Any Al or In containing precursor gases are then removed. An n-type dopant precursor gas is introduced to the reactor along with a gallium-containing precursor and ammonia, such that the resulting n-type region 204 is doped with, for example, Si, Ge, or O.

In stage 53, an indium containing precursor gas, such as tri-methyl indium, may be introduced into the reactor to form lower confinement layer 206. The temperature may also be reduced. The amount of indium incorporated into a layer can be controlled by adjusting the reaction temperature, the ratio of the flow rate of indium containing precursors to the flow rate of other precursors such as gallium containing precursors (hereinafter, the indium/other ratio), or both.

The first quantum well layer 220 in active region 208 is formed in stage 54, by reducing the reactor temperature, by increasing the indium/other ratio, or both. In stage 55, the temperature is increased and/or the indium/other ratio is reduced to form an active region barrier layer 222 having less indium than quantum well layer 220 is formed. Stages 54 and 55 are repeated until the desired number of barrier layers has been formed, then a final quantum well is formed in stage 57.

After the active region is formed, the reactor temperature is raised and/or the indium/other ratio is reduced in stage 58 to form cap layer 210. A p-type dopant precursor is introduced to the reactor, such that the resulting cap layer is doped with, for example, Mg. The reactor temperature is again raised and/or the indium/other ratio is again reduced in stage 59 to form upper confinement layer 212. P-type layers 214 are formed in stage 60. Layers which may be optimized for conductivity or ohmic contact formation may be formed within p-type region 214. A p-contact layer, which will later form the p-contact, is then deposited over the semiconductor layers in stage 61. The device is patterned and portions of the p-contact layer, the p-type semiconductor layers, and the active region are etched away to expose a portion of n-type region 204. An n-contact is then deposited on the exposed portion of n-type region 204. N- and p-contacts may be, for example, Au, Ni, Al, Pt, Co, Ag, Ti, Pd, Rh, Ru, Re, and W, or alloys thereof.

In accordance with the invention, the use of InGaN or GaN confinement, cap, spacer, and barrier layers offers several advantages. First, Mg more easily incorporates into InGaN or GaN, even adjacent to an InGaN—GaN or GaN—GaN interface, than it incorporates into AlGaN. Thus, the use of InGaN or GaN confinement layers reduces variation and uncertainty in placement of the p-n junction and the undesirable impact of undoped AlGaN on resistance and operating voltage experienced with AlGaN confinement layer.

Second, a greater portion of Mg atoms are active at room temperature in Mg-doped InGaN and Mg-doped GaN as compared with Mg doped AlGaN. As a result, in order to reach the required hole concentration, InGaN and GaN confinement layers can be doped with less Mg than AlGaN confinement layers, improving the crystal properties of the confinement layers.

Figure 6:
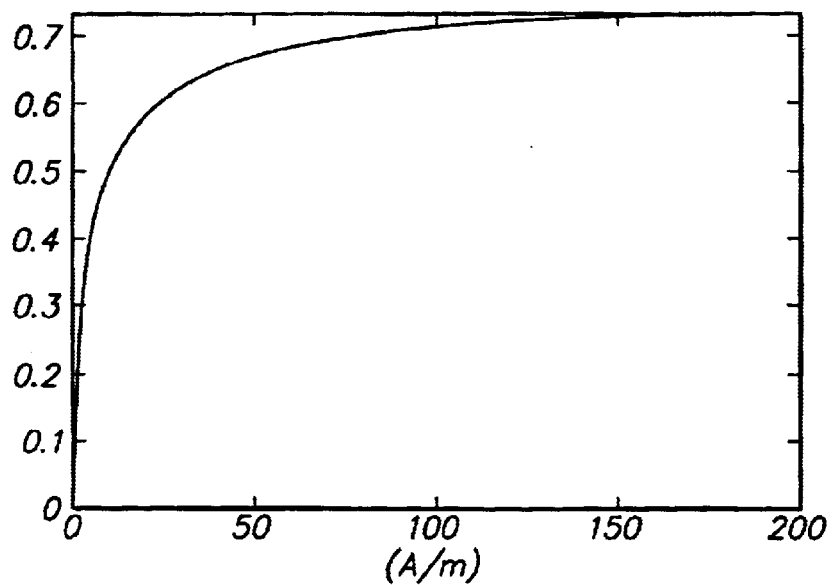
FIG. 6 is a curve of efficiency vs. current density for the device shown in FIG. 4.

Third, the confining properties of an InGaN confinement layer are less affected by polarization fields than the properties of an AlGaN confinement layer. FIG. 6 shows efficiency as a function of current density for the device shown in FIG. 3. Since the device shown in FIG. 3 has effective electron and hole confinement, efficiency increases as current density increases. Thus, at high current density, the device is highly efficient, meaning that as the current density increases, much of the additional current becomes light, not heat.

Fourth, the use of InGaN or GaN confinement layers reduces the fabrication temperature of the upper confinement layer, which reduces the risk of damage to the active region. Also, the use of InGaN or GaN confinement layers may eliminate the growth pause before the growth of AlGaN, which reduces the risk of crystal defects caused by the accumulation of impurities during the growth pause.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention.

We claim:

1. A light emitting device comprising:
   a substrate;
   a first conductivity type layer overlying the substrate;
   a lower confinement layer overlying the first conductivity type layer, the lower confinement layer comprising $In_xGa_{1-x}N$, wherein $0 \leq x \leq 0.15$;
   a spacer layer overlying the lower confinement layer;
   an active region overlying the spacer layer, the active region comprising:
      a quantum well layer; and
      a barrier layer comprising indium;
   a cap layer overlying the active region;
   an upper confinement layer overlying and adjacent to the cap layer, the upper confinement layer comprising $In_xGa_{1-x}N$, wherein $0 \leq x \leq 0.15$; and
   a second conductivity type layer overlying the upper confinement layer;
   wherein:
      the spacer layer and the cap layer have larger band gaps than the quantum well layer;
      the upper confinement layer and the lower confinement layer have larger band gaps than the spacer layer and the cap layer; and
      one of the spacer layer and the cap layer comprises indium.

2. The light emitting device of claim 1 wherein
   the spacer layer comprises indium; and
   the barrier layer comprises InGaN with an indium composition between about 1% and about 5%.

3. The light emitting device of claim 2 wherein the barrier layer is InGaN having an indium composition between about 1% and about 5%.

4. The light emitting device of claim 2 wherein the barrier layer is doped with a dopant of first conductivity type to a concentration between about $10^{15}$ cm$^{-3}$ and about $10^{19}$ cm$^{-3}$.

5. The light emitting device of claim 2 wherein:
   the barrier layer has a thickness between about 20 angstroms and about 250 angstroms;
   the quantum well layer has an indium composition between about 4% and about 25%; and
   the quantum well layer has a thickness between about 10 angstroms and about 60 angstroms.

6. The light emitting device of claim 1 wherein the barrier layer, the spacer layer, and the cap layer each have an indium composition less than an indium composition of the quantum well layer.

7. The light emitting device of claim 1 wherein the lower confinement layer comprises $In_xGa_{1-x}N$, wherein $0 \leq x \leq 0.02$.

8. The light emitting device of claim 1 wherein the lower confinement layer is doped with a dopant of first conductivity type to a concentration between about $10^{15}$ cm$^{-3}$ and about $10^{22}$ cm$^{-3}$.

9. The light emitting device of claim 1 wherein the lower confinement layer has a thickness between about 50 and about 20,000 angstroms.

10. The light emitting device of claim 2 wherein:
    the lower confinement layer has a first indium composition;
    the spacer layer has a second indium composition;
    the quantum well layer has a third indium composition;
    the third indium composition is greater than the second indium composition; and
    the second indium composition is greater than or equal to the first indium composition.

11. The light emitting device of claim 1 wherein the upper confinement layer comprises $In_xGa_{1-x}N$, wherein $0 \leq x \leq 0.02$.

12. The light emitting device of claim 1 wherein the upper confinement layer is doped with a dopant of second conductivity type to a concentration between about $10^{15}$ cm$^{-3}$ and about $10^{22}$ cm$^{-3}$.

13. The light emitting device of claim 12 wherein the dopant comprises Mg.

14. The light emitting device of claim 1 wherein the upper confinement layer has a thickness between about 50 and about 20,000 angstroms.

15. The light emitting device of claim 2 wherein:
    the upper confinement layer has a first indium composition;
    the cap layer has a second indium composition;
    the quantum well layer has a third indium composition;
    the third indium composition is greater than the second indium composition; and
    the second indium composition is greater than or equal to the first indium composition.

16. The light emitting device of claim 1 wherein the cap layer comprises $In_xGa_{1-x}N$, wherein $0 \leq x \leq 0.15$.

17. The light emitting device of claim 1 wherein the spacer layer comprises $In_xGa_{1-x}N$, wherein $0 \leq x \leq 0.15$.

18. The light emitting device of claim 1 wherein at least one of the cap layer, the upper confinement layer, the lower confinement layer, and the spacer layer comprises a graded composition of indium.

19. The light emitting device of claim 1 wherein the cap layer is doped with a dopant of second conductivity type to a concentration between about $10^{15}$ cm$^{-3}$ and about $10^{21}$ cm$^{-3}$.

20. The light emitting device of claim 1 wherein the spacer layer is doped with a dopant of first conductivity type to a concentration between about $10^{15}$ cm$^{-3}$ and about $10^{21}$ cm$^{-3}$.

21. The light emitting device of claim 1 wherein the first conductivity type layer and the second conductivity type layer have larger band gaps than the lower confinement layer and the upper confinement layer.

22. The light emitting device of claim 1 wherein the spacer layer and the cap layer have larger band gaps than the barrier layer.

23. The light emitting device of claim 1 wherein the spacer layer comprises a composition graded from a first composition in a first region of the spacer layer to a second composition in a second region of the spacer layer, wherein:

the first region is closer to the lower confinement layer than the active region;

the second region is closer to the active region than the lower confinement layer; and the second composition comprises a higher indium composition than the first composition.

24. The light emitting device of claim 1 wherein the cap layer comprises a composition graded from a first composition in a first region of the cap layer to a second composition in a second region of the cap layer, wherein:

the first region is closer to the upper confinement layer than the active region;

the second region is closer to the active region than the upper confinement layer; and the second composition comprises a higher indium composition than the first composition.

25. The light emitting device of claim 1 wherein the upper confinement layer comprises a composition graded from a first composition in a first region of the upper confinement layer to a second composition in a second region of the upper layer, wherein:

the first region is closer to the second conductivity type layer than the cap layer;

the second region is closer to the cap layer than the second conductivity type layer; and the second composition comprises a higher indium composition than the first composition.

26. The light emitting device of claim 1 wherein the lower confinement layer comprises a composition graded from a first composition in a first region of the lower confinement layer to a second composition in a second region of the lower confinement layer, wherein:

the first region is closer to the first conductivity type layer than the spacer layer;

the second region is closer to the spacer layer than the first conductivity type layer; and the second composition comprises a higher indium composition than the first composition.

27. The light emitting device of claim 2 wherein the spacer layer and the cap layer have indium compositions greater than the barrier layer.

\* \* \* \* \*

UNITED STATES PATENT AND TRADEMARK OFFICE
CERTIFICATE OF CORRECTION

PATENT NO. : 6,833,564 B2
DATED : December 21, 2004
INVENTOR(S) : Yu-Chen Shen and Mira S. Misra It is certified that error appears in the above-identified patent and that said Letters Patent is hereby corrected as shown below:

<u>Column 8,</u>
Line 4, cancel "5%" and substitute -- 15% --.

Signed and Sealed this

Seventeenth Day of May, 2005

JON W. DUDAS
*Director of the United States Patent and Trademark Office*